(12) United States Patent
Yamashita et al.

(10) Patent No.: US 10,297,513 B1
(45) Date of Patent: May 21, 2019

(54) STACKED VERTICAL NFET AND PFET

(71) Applicant: International Business Machines Corporation, Armonk, NY (US)

(72) Inventors: Tenko Yamashita, Schenectady, NY (US); Chen Zhang, Albany, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/858,267

(22) Filed: Dec. 29, 2017

(51) Int. Cl.
| | |
|---|---|
| *H01L 21/8238* | (2006.01) |
| *H01L 21/822* | (2006.01) |
| *H01L 29/10* | (2006.01) |
| *H01L 29/08* | (2006.01) |
| *H01L 29/06* | (2006.01) |
| *H01L 21/84* | (2006.01) |
| *H01L 29/66* | (2006.01) |

(Continued)

(52) U.S. Cl.
CPC ........ *H01L 21/823885* (2013.01); *H01L 21/02129* (2013.01); *H01L 21/2256* (2013.01); *H01L 21/28079* (2013.01); *H01L 21/28088* (2013.01); *H01L 21/76802* (2013.01); *H01L 21/76877* (2013.01); *H01L 21/8221* (2013.01); *H01L 21/823807* (2013.01); *H01L 21/823814* (2013.01); *H01L 21/823828* (2013.01); *H01L 21/823871* (2013.01); *H01L 21/84* (2013.01); *H01L 27/0688* (2013.01); *H01L 27/092* (2013.01); *H01L 27/1203* (2013.01); *H01L 29/0649* (2013.01); *H01L 29/0847* (2013.01); *H01L 29/1037* (2013.01); *H01L 29/495* (2013.01); *H01L 29/4966* (2013.01); *H01L 29/517* (2013.01); *H01L 29/6656* (2013.01); *H01L 29/66666* (2013.01); *H01L 29/7827* (2013.01)

(58) Field of Classification Search
CPC combination set(s) only.
See application file for complete search history.

(56) References Cited

U.S. PATENT DOCUMENTS

| | | |
|---|---|---|
| 7,074,656 B2 | 7/2006 | Yeo et al. |
| 7,098,478 B2 | 8/2006 | Takaura et al. |

(Continued)

OTHER PUBLICATIONS

A. Veloso et al., "Junctionless gate-all-around lateral and vertical nanowire FETs with simplified processing for advanced logic and analog/RF applications and scaled SRAM cells," Symposium on VLSI Technology, Jun. 2016, 2 total pages.

(Continued)

*Primary Examiner* — Mamadou L Diallo
(74) *Attorney, Agent, or Firm* — Vazken Alexanian; Michael J. Chang, LLC

(57) ABSTRACT

The present invention provides stacked VFET devices. In one aspect, a method of forming a stacked VFET device includes: patterning a fin(s) in a wafer having a vertical fin channel of a VFET1 separated from a vertical fin channel of a VFET2 by an insulator; forming a bottom source and drain of the VFET1 below the vertical fin channel of the VFET1; forming a gate of the VFET1 alongside the vertical fin channel of the VFET1; forming a gate of the VFET2 alongside the vertical fin channel of the VFET2; forming a top source and drain of the VFET1 above the vertical fin channel of the VFET1; forming a bottom source and drain of the VFET2 below the vertical fin channel of the VFET2; and forming a top source and drain of the VFET2 above the vertical fin channel of the VFET2. A stacked VFET device is also provided.

21 Claims, 15 Drawing Sheets

(51) Int. Cl.
*H01L 21/02* (2006.01)
*H01L 21/768* (2006.01)
*H01L 29/51* (2006.01)
*H01L 29/49* (2006.01)
*H01L 21/28* (2006.01)
*H01L 29/78* (2006.01)
*H01L 27/092* (2006.01)
*H01L 27/12* (2006.01)
*H01L 21/225* (2006.01)
*H01L 27/06* (2006.01)

(56) References Cited

U.S. PATENT DOCUMENTS

| | | |
|---|---|---|
| 7,683,428 B2 | 3/2010 | Chidambarrao et al. |
| 9,177,890 B2 | 11/2015 | Du |
| 9,659,963 B2 | 5/2017 | Cheng et al. |
| 9,780,197 B1 * | 10/2017 | Xie .................. H01L 29/66553 |
| 9,960,271 B1 * | 5/2018 | Xie .................... H01L 29/7827 |
| 10,090,204 B1 * | 10/2018 | Zang ............... H01L 21/823462 |
| 10,141,448 B1 * | 11/2018 | Miao ................. H01L 29/78642 |
| 2006/0261406 A1 | 11/2006 | Chen |
| 2009/0200604 A1 * | 8/2009 | Chidambarrao .. H01L 29/66787 257/329 |
| 2016/0043074 A1 | 2/2016 | Hurley et al. |
| 2017/0005106 A1 * | 1/2017 | Zhang ............... H01L 29/42392 |
| 2017/0025412 A1 | 1/2017 | Jun et al. |

OTHER PUBLICATIONS

K. Nakazato et al., "Silicon stacked tunnel transistor for high-speed and high-density random access memory gain cells," Electronics Letters, vol. 35, No. 10, May 1999, pp. 848-850.

\* cited by examiner

US 10,297,513 B1

STACKED VERTICAL NFET AND PFET

FIELD OF THE INVENTION

The present invention relates to vertical field effect transistors (VFETs), and more particularly, to stacked vertical n-channel and p-channel VFETs (NFETs and PFETs) and techniques for formation thereof.

BACKGROUND OF THE INVENTION

Stacking field-effect transistors (FETs) in the vertical direction gives an additional dimension for complementary metal-oxide-semiconductor (CMOS) area scaling. However, it is very challenging to stack planar FETs.

Vertical field effect transistors (VFETs) on the other hand have a unique structure that can help the stacking process. Namely, as opposed to planar CMOS devices, VFETs are oriented with a vertical fin channel disposed on a bottom source/drain and a top source/drain disposed on the fin channel. The gate runs vertically alongside the vertical fin channel. VFETs have been pursued as a potential device option for scaling CMOS to the 5 nanometer (nm) node and beyond.

Accordingly, stacked VFET designs and techniques for formation thereof would be desirable.

SUMMARY OF THE INVENTION

The present invention provides stacked vertical n-channel and p-channel vertical field effect transistors (VFETs) (NFETs and PFETs) and techniques for formation thereof. In one aspect of the invention, a method of forming a stacked VFET device is provided. The method includes: patterning at least one fin in a wafer, the at least one fin having a vertical fin channel of a first VFET (VFET1) separated from a vertical fin channel of a second VFET (VFET2) by an insulator; forming a bottom source and drain of the VFET1 below the vertical fin channel of the VFET1; forming a gate of the VFET1 alongside the vertical fin channel of the VFET1; forming a gate of the VFET2 alongside the vertical fin channel of the VFET2; forming a top source and drain of the VFET1 above the vertical fin channel of the VFET1; forming a bottom source and drain of the VFET2 below the vertical fin channel of the VFET2; forming a top source and drain of the VFET2 above the vertical fin channel of the VFET2; and depositing an interlayer dielectric (ILD) over the at least one fin.

In another aspect of the invention, a VFET device is provided. The VFET device includes: at least one fin patterned in a wafer, the at least one fin having a vertical fin channel of a first VFET (VFET1) separated from a vertical fin channel of a second VFET (VFET2) by an insulator; a bottom source and drain of the VFET1 present below the vertical fin channel of the VFET1; a gate of the VFET1 disposed alongside the vertical fin channel of the VFET1; a gate of the VFET2 disposed alongside the vertical fin channel of the VFET2; a top source and drain of the VFET1 present above the vertical fin channel of the VFET1; a bottom source and drain of the VFET2 present below the vertical fin channel of the VFET2; a top source and drain of the VFET2 present above the vertical fin channel of the VFET2; and an ILD over the at least one fin.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming stacked vertical n-channel and p-channel VFETs (NFETs and PFETs). By comparison, typical VFET layouts include vertical NFETs and PFETs side-by-side one another on a wafer. Thus, in addition to the vertical orientation of the VFET structure, the present stacked VFET designs provide another dimension for complementary metal-oxide-semiconductor (CMOS) area scaling.

An exemplary embodiment for forming a stacked VFET (NFET and PFET) device is now described by way of reference to FIGS. 1-7. Techniques for forming contacts to the device are also provided below. The stacked VFET design includes an NFET and a PFET stacked in either order. Namely, configurations are contemplated herein where either the NFET or the PFET is present at the bottom and top of the stack. Thus, both NFET stacked on PFET and PFET stacked on NFET designs are described herein. As such, in the description that follows, reference will be made to a bottom VFET in the stack and a top VFET in the stack. The bottom VFET can be either an NFET or a PFET. Likewise the top VFET can be either an NFET or a PFET. For clarity, the designations "first VFET" or "VFET1" and "second VFET" or "VFET2" may also be used herein to refer to the bottom and top VFETs, respectively.

Figure 1:
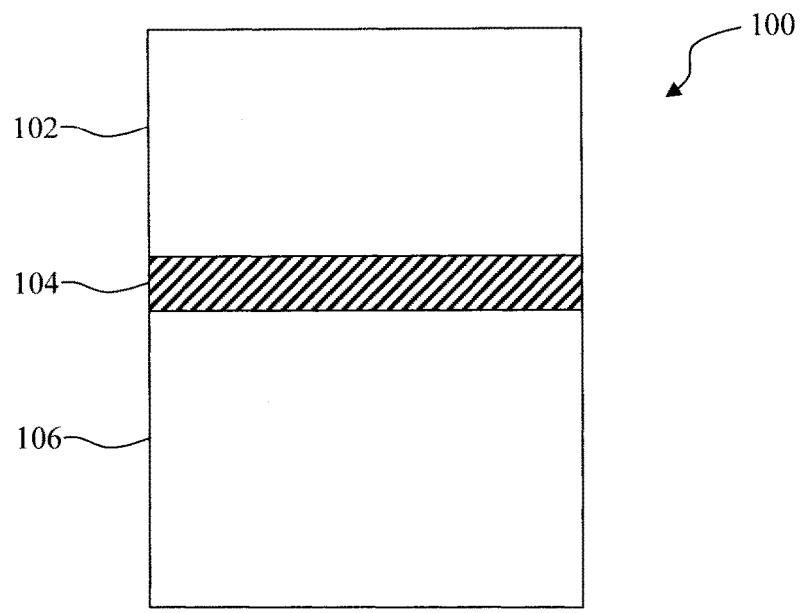
FIG. 1 is a cross-sectional diagram illustrating a starting wafer having a semiconductor-on-insulator (SOI) layer separated from an underlying substrate by a buried insulator according to an embodiment of the present invention.

As shown in FIG. 1, the process begins with a wafer 100 (in which one or more fins will be patterned). In the present example, wafer 100 is a semiconductor-on-insulator (SOI) wafer. A SOI wafer includes an SOI layer 102 separated from an underlying substrate 106 by a buried insulator 104. When the buried insulator is an oxide it is referred to herein as a buried oxide or BOX. According to an exemplary embodiment, the buried insulator 104 is thin, e.g., buried insulator 104 has a thickness of from about 10 nanometers (nm) to about 40 nm, and ranges therebetween. A thin buried insulator 104 makes the fabrication easier by reducing the total fin height.

The SOI layer 102 and the substrate 106 each can include any suitable semiconductor, such as silicon (Si), germanium (Ge), silicon germanium (SiGe), and/or a III-V semiconductor. Preferably, the SOI layer 102 and the substrate 106 are both undoped. According to an exemplary embodiment, a different material is used for SOI layer 102 than for the substrate 106, and the particular materials employed for the SOI layer 102 and the substrate 106 vary depending on whether the bottom/top VFETs are NFET/PFET or PFET/NFET. For instance, according to an exemplary embodiment, Si is used as the channel material for the NFET and SiGe is used as the channel material for the PFET. As will become apparent from the description that follows, a portion of the fin(s) patterned in the SOI layer 102 will serve as the vertical fin channel of the top VFET in the stack, while a portion of the fin(s) patterned in the substrate 106 will serve as the vertical fin channel of the bottom VFET in the stack. Thus, according to this particular example, if the device is configured with the bottom VFET/top VFET as NFET/PFET, then the substrate 106 would be Si and the SOI layer 102 would be SiGe. On the other hand, if the device is configured with the bottom VFET/top VFET as PFET/NFET, then the SOI layer 102 would be Si and the substrate 106 would be SiGe.

Figure 2:
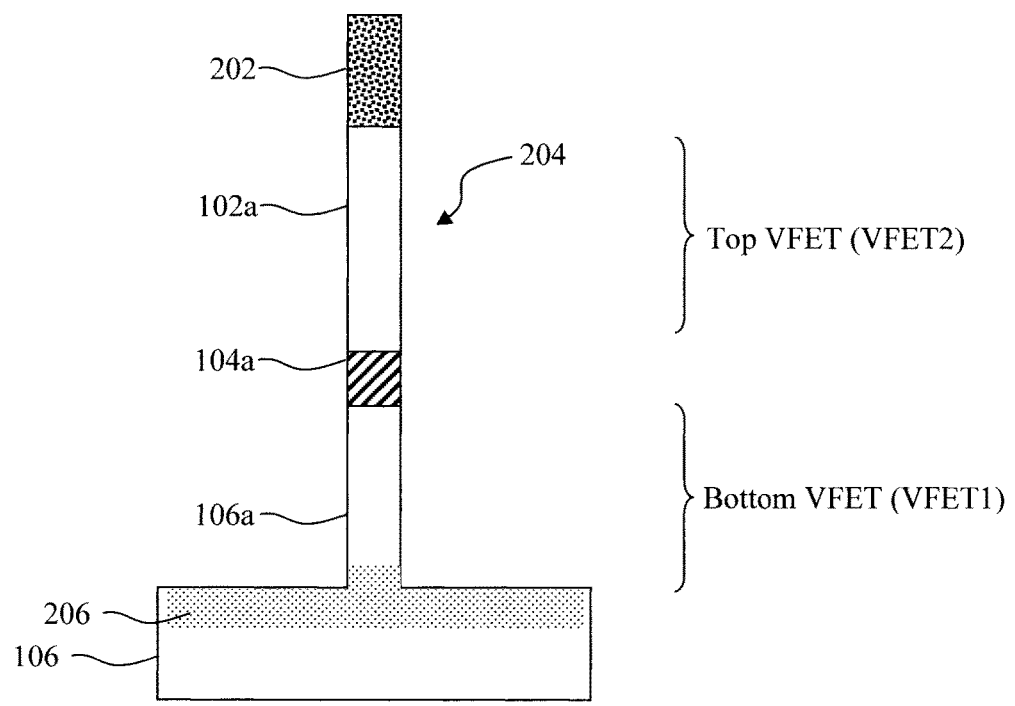
FIG. 2 is a cross-sectional diagram illustrating at least one fin hardmask having been patterned on the SOI layer, the fin hardmask having been used to form at least one fin in the wafer to form a vertical fin channel of a bottom VFET separated from a vertical fin channel of a top VFET by an insulator, and a bottom source and drain for the bottom VFET having been formed at the base of the fin below a vertical fin channel of the bottom VFET according to an embodiment of the present invention.

As shown in FIG. 2, standard lithography and etching techniques are used to pattern at least one fin hardmask 202 on the SOI layer 102. Suitable materials for the fin hardmask(s) 202 include, but are not limited to, nitride hardmask materials such as silicon nitride (SiN) and/or silicon oxynitride (SiON). The fin hardmask(s) 202 is then used to form at least one fin 204 in the wafer 100. A directional etching process, such as reactive ion etching (RIE), can be used for the fin etch. As shown in FIG. 2, the fin 204 extends through the SOI layer 102, through the buried insulator 104 and partway through the substrate 106.

The portions of the fin 204 patterned in the SOI layer 102 will now be given the reference numeral 102a, the portions of the fin 204 patterned in the buried insulator 104 will now be given the reference numeral 104a, and the portions of the fin 204 patterned in the substrate 106 will now be given the reference numeral 106a. As provided above, the portion 102a of the fin 204 patterned in the SOI layer 102 will serve as the vertical fin channel of the top VFET in the stack, while the portion 106a of the fin 204 patterned in the substrate 106 will serve as the vertical fin channel of the bottom VFET in the stack.

As shown in FIG. 2, a bottom source and drain 206 for the bottom VFET is then formed at the base of the fin 204 below the vertical fin channel of the bottom VFET. According to an exemplary embodiment, the bottom source and drain 206 is formed using ion implantation of an n-type or p-type dopant into the substrate 106 beneath the fin 204. The bottom source and drain 206 could also be formed by epitaxial growth of highly doped semiconductors. Suitable n-type dopants include, but are not limited to, phosphorous (P) and/or arsenic (As), and suitable p-type dopants include, but are not limited to, boron (B). The polarity of the dopant (n-type or p-type) for the bottom source and drain 206 varies depending on whether the bottom VFET is an NFET or PFET. In the case of an NFET, the bottom source and drain 206 includes a p-type dopant. On the other hand, in the case of a PFET, the bottom source and drain 206 includes an n-type dopant.

An anneal is then used to activate the dopants in the bottom source and drain 206. According to an exemplary embodiment, the activation anneal is performed using a process such as rapid thermal annealing (RTA) at a temperature of from about 850° C. to about 1000° C., and ranges therebetween.

Figure 3:
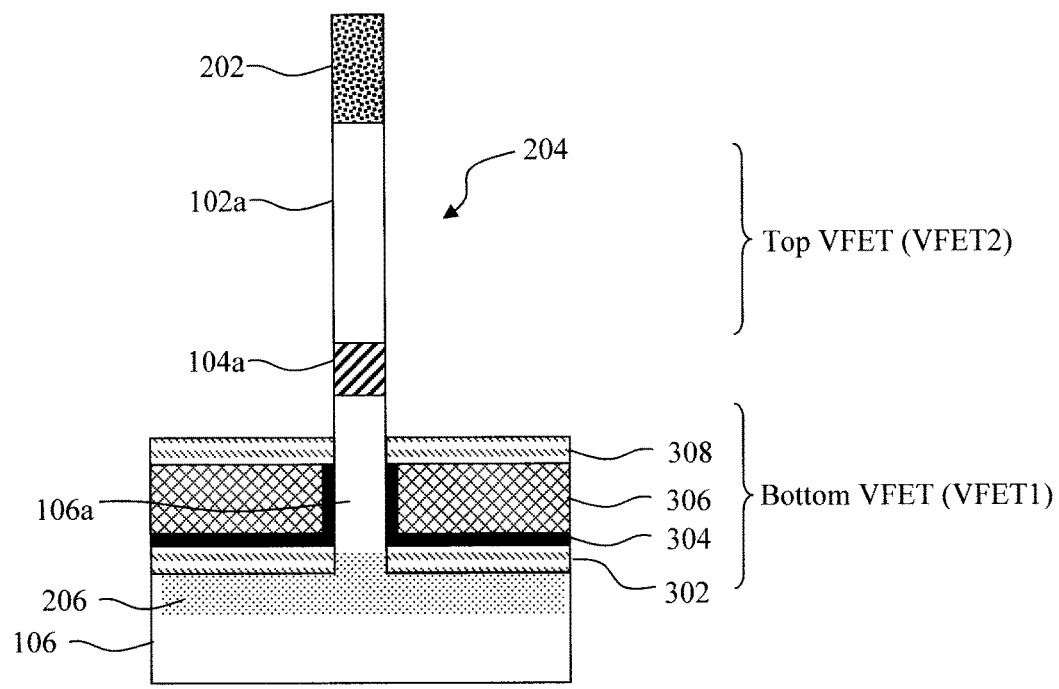
FIG. 3 is a cross-sectional diagram illustrating bottom spacers of the bottom VFET having been formed on the bottom source and drain of the bottom VFET, a gate of the bottom VFET having been formed alongside the fin above the bottom spacers of the bottom VFET, and top spacers of the bottom VFET having been formed above the gate of the bottom VFET according to an embodiment of the present invention.

Next, as shown in FIG. 3, bottom spacers 302 of the bottom VFET are formed on the bottom source and drain 206. Suitable materials for the bottom spacers 302 include, but are not limited to, silicon dioxide ($SiO_2$) and/or silicon oxycarbide (SiOC).

According to an exemplary embodiment, the bottom spacers 302 are formed using a directional deposition process whereby the spacer material is deposited with a greater amount of the material being deposited on horizontal surfaces (including on top of the bottom source and drain 206), as compared to vertical surfaces (such as along sidewalls of the fin 204). Thus, when an etch is used on the spacer material, the timing of the etch needed to remove the spacer material from the vertical surfaces will leave the bottom spacers 302 shown in FIG. 3 on the bottom source and drain 206 since a greater amount of the spacer material was deposited on these (horizontal) surfaces to begin with. By way of example only, a high density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

A gate (i.e., a gate dielectric and gate conductor) of the bottom VFET is next formed alongside the fin 204 above the bottom spacers 302. To form the gate, a conformal gate dielectric 304 is deposited onto the bottom spacers 302 and alongside the fin 204. A gate conductor 306 is then deposited onto the conformal gate dielectric 304. See FIG. 3.

According to an exemplary embodiment, a metal gate is formed wherein the gate conductor 306 is a metal or combination of metals and the gate dielectric 304 is a high-κ dielectric. For instance, the gate conductor 306 is a workfunction setting metal. The particular workfunction setting metal employed can vary depending on whether the bottom VFET is an NFET (n-type workfunction setting metal) or PFET (p-type workfunction setting metal). Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and tungsten (W). TiN and TaN are relatively thick (e.g., greater than about 2 nanometers (nm)) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for hafnium oxide ($HfO_2$) rather than 4 for silicon dioxide). Suitable high-κ gate dielectrics include, but are not limited to, $HfO_2$ and/or lanthanum oxide ($La_2O_3$).

Next, top spacers 308 of the bottom VFET are formed above the gate. See FIG. 3. Suitable materials for the top spacers 308 include, but are not limited to, $SiO_2$ and/or SiOC.

The top spacers 308 may also be formed using a directional deposition process, such as HDP CVD or PVD. As described above, with a directional deposition process a greater amount of the spacer material is deposited on horizontal surfaces, as compared to vertical surfaces (such as along sidewalls of the fin 204). Thus, when an etch is used on the spacer material, the timing of the etch needed to remove the spacer material from the vertical surfaces will leave the top spacers 308 shown in FIG. 3 above the gate of the bottom VFET since a greater amount of the spacer material was deposited on these (horizontal) surfaces to begin with. By way of example only, a high density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

In order to form a top source and drain for the bottom VFET, a doped layer 402 for the bottom VFET is next deposited onto the top spacers 308 alongside the fin 204. See FIG. 4. The purpose of the doped layer 402 is two-fold. First, the doped layer 402 serves as a dopant source for forming the top source and drain for the bottom VFET. Second, the doped layer 402 also serves as a sacrificial layer during contact formation, i.e., doped layer 402 is later removed and replaced with a contact metal. Regarding its first function, i.e., serving as a dopant source for the top source and drain for the bottom VFET, the particular dopant employed depends on whether the bottom VFET is an NFET or PFET. In the case of an NFET, the top source and drain includes a p-type dopant. On the other hand, in the case of a PFET, the bottom source and drain includes an n-type dopant.

According to an exemplary embodiment, the dopant sources used in the present process flow include boron-doped glass (BSG) as a p-type dopant source and phosphorous-doped glass (PSG) an n-type dopant source. Thus, in the case where the bottom VFET is an NFET then the doped layer 402 is formed from PSG. On the other hand, in the case where the bottom VFET is a PFET then the doped layer 402 is formed from BSG. In the same manner as described above, the doped layer 402 can be deposited using a directional deposition process, such as HDP CVD or PVD, with a greater amount of the material (e.g., PSG or BSG) being deposited onto horizontal surfaces, followed by an etch to remove the material from vertical surfaces resulting in formation of the doped layer 402 shown in FIG. 4.

Figure 4:
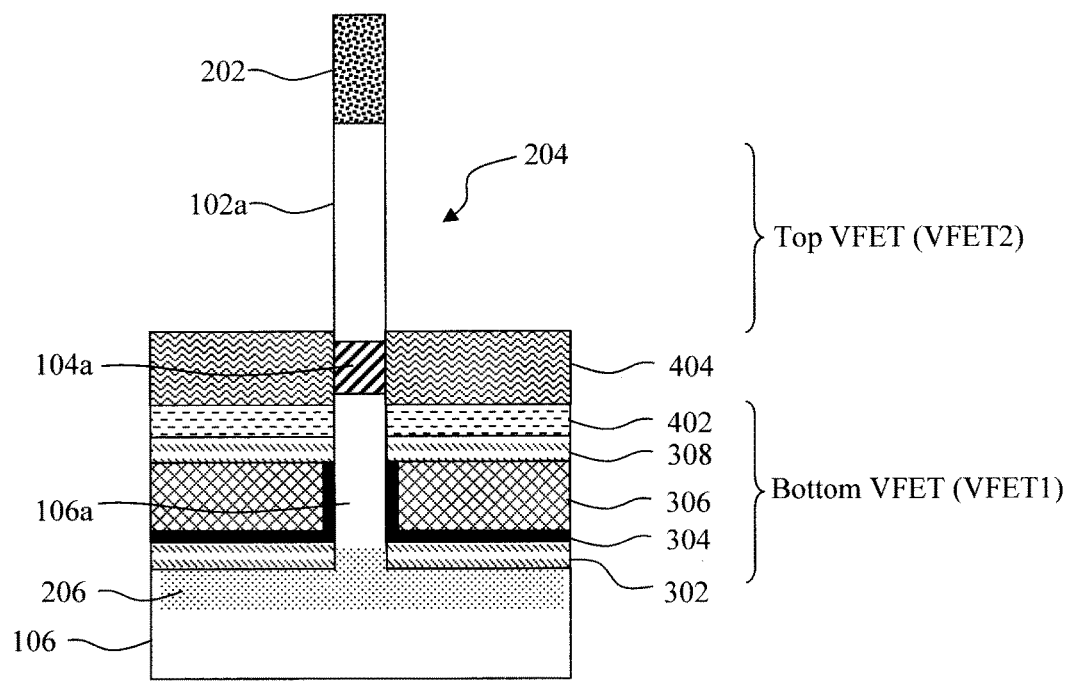
FIG. 4 is a cross-sectional diagram illustrating a doped layer for the bottom VFET having been deposited onto the top spacers of the bottom VFET alongside the fin, and an isolation spacer having been formed above the doped layer for the bottom VFET according to an embodiment of the present invention.

As provided above, the portion 102a of the fin 204 patterned in the SOI layer 102 will serve as the vertical fin channel of the top VFET in the stack, while the portion 106a of the fin 204 patterned in the substrate 106 will serve as the vertical fin channel of the bottom VFET in the stack. Referring to FIG. 4, it is also notable that the patterned portion 104a of the buried insulator 104 separates the vertical fin channel (portion 106a) of the bottom VFET from the vertical fin channel (portion 102a) of the top VFET. The doped layer 402 is present alongside the fin below the portion 104a of the buried insulator 104.

An n-p isolation spacer 404 is then formed above the doped layer 402 alongside the fin 204. Specifically, as shown in FIG. 4, the isolation spacer 404 is formed alongside the portion 104a of the buried insulator 104. The isolation spacer 404 separates the doped layer 402 (of the bottom VFET) from a first doped layer 502 of the top VFET (to be formed as described below) which, like the doped layer 402 contains an n-type or p-type dopant. Thus, the isolation spacer 404 isolates these n-/p-type doped layers from one another. Suitable materials for the isolation spacer 404 include, but are not limited to, dielectric materials such as SiN and/or SiON.

A top VFET is then formed over the bottom VFET. Formation of the top VFET proceeds in the same general manner as with the bottom VFET, however with a device of the opposite polarity being formed. Namely, if the bottom VFET is an NFET, then a PFET is formed as the top VFET. Conversely, if the bottom VFET is a PFET, then an NFET is formed as the top VFET.

One difference in the formation of the top VFET is that doped layers (e.g., BSG or PSG) are used at the bottom and top of the device to form both the bottom and top source and drains. By comparison, with the bottom VFET a different doping process such as ion implantation followed by an activation anneal can be implemented for the bottom source and drain 206—see above.

Figure 5:
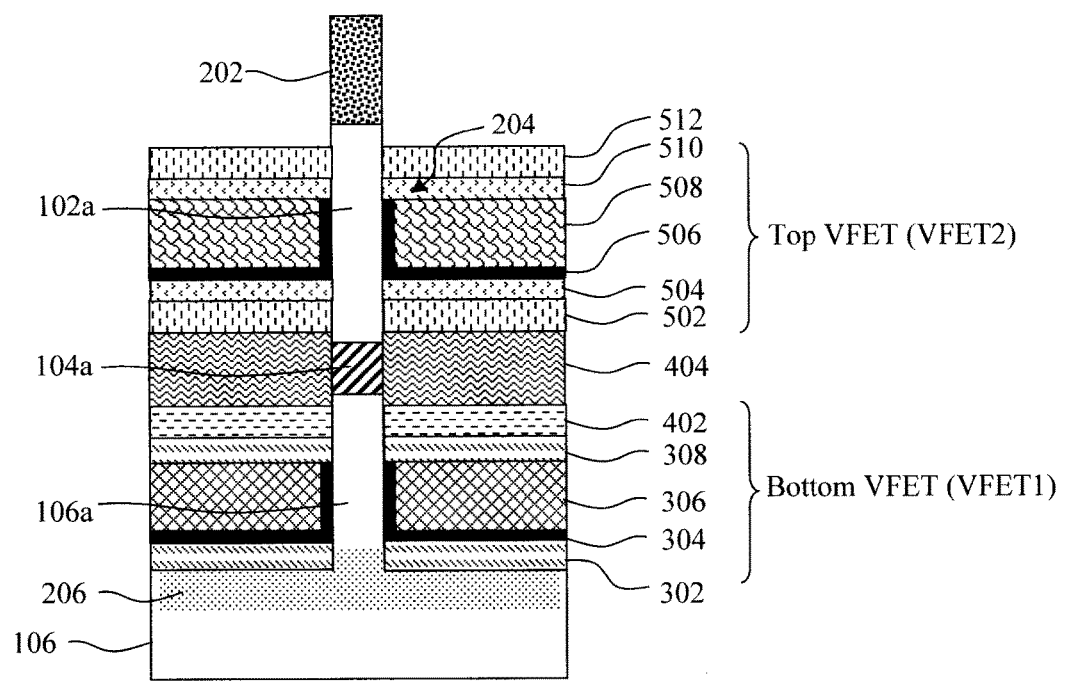
FIG. 5 is a cross-sectional diagram illustrating a first doped layer of the top VFET having been deposited onto the isolation spacer, bottom spacers of the top VFET having been formed on the first doped layer of the top VFET, a gate of the top VFET having been formed above the bottom spacers of the top VFET, top spacers of the top VFET having been formed above the gate of the top VFET, and a second doped layer of the top VFET having been deposited onto the top spacers of the top VFET according to an embodiment of the present invention.

Namely, as shown in FIG. 5 a first doped layer 502 of the top VFET is deposited onto the isolation spacer 404 alongside the fin 204. As with the bottom VFET, the purpose of the doped layer 502 is two-fold. First, the doped layer 502 serves as a dopant source for forming the bottom source and drain for the top VFET. Second, the doped layer 502 also serves as a sacrificial layer during contact formation, i.e., doped layer 502 is later removed and replaced with a contact metal. Regarding its first function, i.e., serving as a dopant source for the bottom source and drain for the top VFET, the particular dopant employed depends on whether the top VFET is an NFET or PFET. In the case of an NFET, the bottom source and drain includes a p-type dopant. On the other hand, in the case of a PFET, the top source and drain includes an n-type dopant.

According to an exemplary embodiment, when the top VFET is an NFET the doped layer 502 is formed from PSG, and when the top VFET is a PFET the doped layer 502 is formed from BSG. In the same manner as described above, the doped layer 502 can be deposited using a directional deposition process, such as HDP CVD or PVD, with a greater amount of the material (e.g., PSG or BSG) being deposited onto horizontal surfaces, followed by an etch to remove the material from vertical surfaces resulting in formation of the doped layer 502 shown in FIG. 5.

Bottom spacers 504 of the top VFET are next formed on the doped layer 502. Suitable materials for the bottom spacers 504 include, but are not limited to, $SiO_2$ and/or SiOC.

In the same manner as described above, the bottom spacers 504 can be deposited using a directional deposition process, such as HDP CVD or PVD, with a greater amount of the spacer material being deposited onto horizontal surfaces, followed by an etch to remove the material from vertical surfaces resulting in formation of the bottom spacers 504 shown in FIG. 5.

A gate (i.e., a gate dielectric and gate conductor) of the top VFET is next formed alongside the fin 204 above the bottom spacers 504. To form the gate, a conformal gate dielectric 506 is deposited onto the bottom spacers 504 and alongside the fin 204 (above the portion 104a of the buried insulator 104). A gate conductor 508 is then deposited onto the conformal gate dielectric 506. See FIG. 5.

According to an exemplary embodiment, a metal gate is formed wherein the gate conductor 508 is a metal or combination of metals and the gate dielectric 506 is a high-K dielectric. For instance, the gate conductor 508 is a workfunction setting metal. The particular workfunction setting metal employed varies depending on whether the top VFET is an NFET (n-type workfunction setting metal) or PFET (p-type workfunction setting metal). As provided above, suitable n-type workfunction setting metals include, but are not limited to, TiN, TaN and/or Al-containing alloys such as TiAl, TiAlN, TiAlC, TaAl, TaAlN, and/or TaAlC. Suitable p-type workfunction setting metals include, but are not limited to, TiN, TaN, and W. Suitable high-κ gate dielectrics include, but are not limited to, $HfO_2$ and/or $La_2O_3$.

Next, top spacers 510 of the top VFET are formed above the gate. Suitable materials for the top spacers 510 include, but are not limited to, $SiO_2$ and/or SiOC. In the same manner as described above, the top spacers 510 can be deposited using a directional deposition process, such as HDP CVD or PVD, with a greater amount of the spacer material being deposited onto horizontal surfaces, followed by an etch to remove the material from vertical surfaces resulting in formation of the top spacers 510 shown in FIG. 5.

A second doped layer 512 of the top VFET is deposited onto the top spacers 510 alongside the fin 204. See FIG. 5. As described above, the doped layer 512 serves both as a dopant source for forming the top source and drain for the top VFET, and as a sacrificial layer during contact formation, i.e., doped layer 512 is later removed and replaced with a contact metal. Regarding its first function, i.e., serving as a dopant source for the top source and drain for the top VFET, the particular dopant employed depends on whether the top VFET is an NFET or PFET. In the case of an NFET, the top source and drain includes a p-type dopant, and in the case of a PFET, the top source and drain includes an n-type dopant.

Figure 6:
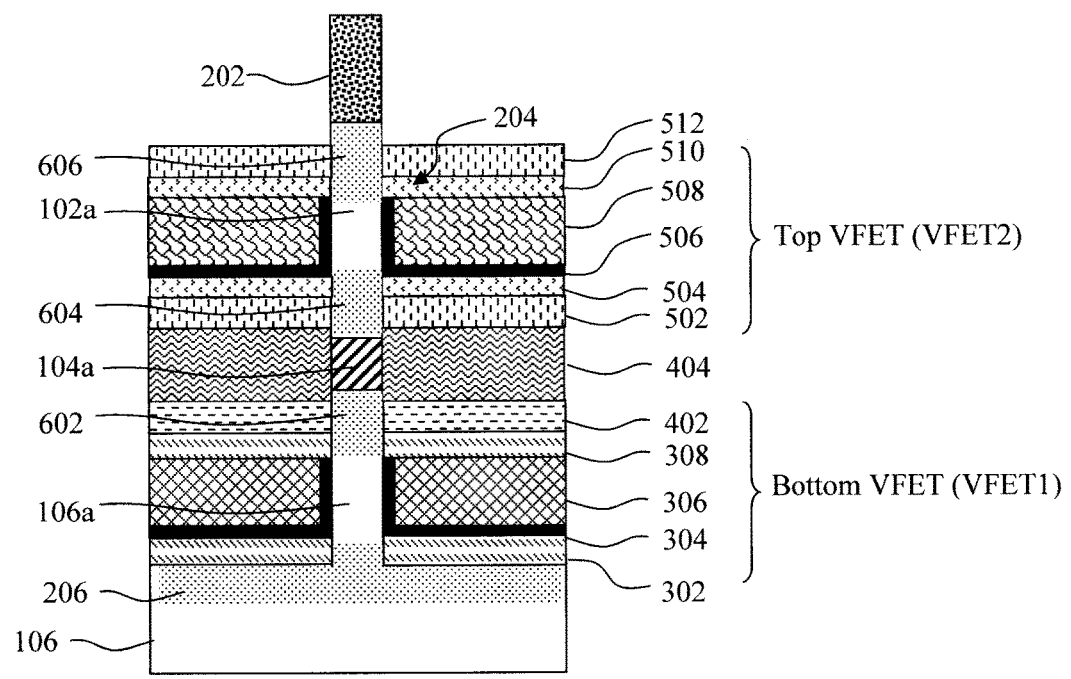
FIG. 6 is a cross-sectional diagram illustrating a drive-in anneal having been used to drive dopants from the doped layer of the bottom VFET and the first/second doped layers of the top VFET into the fin above the vertical fin channel of the bottom VFET and into the fin below/above the vertical fin channel of the top VFET according to an embodiment of the present invention.
Figure 7:
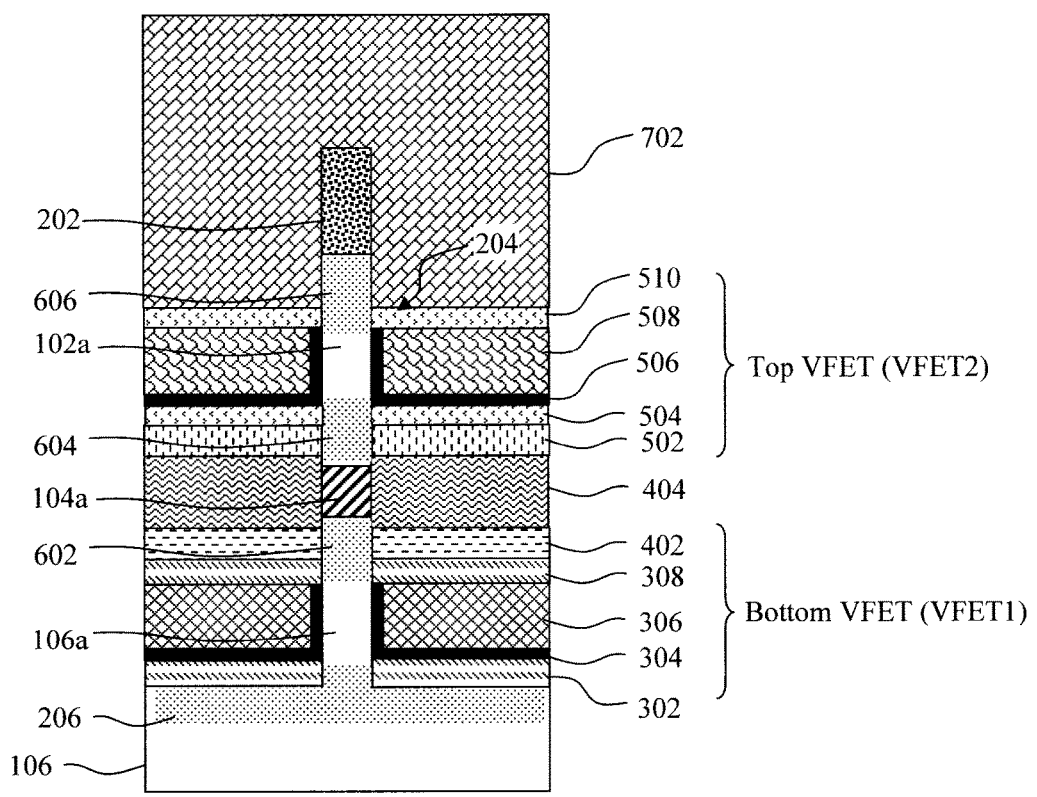
FIG. 7 is a cross-sectional diagram illustrating the second doped layer of the top VFET having been removed, and an interlayer dielectric (ILD) having been deposited over the fin according to an embodiment of the present invention.

A drive-in anneal is then used to drive dopants from the doped layers 402 and 502/512 into the fin 204 above the vertical fin channel (portion 106a) of the bottom VFET and into the fin 204 below/above the vertical fin channel (portion 102a) of the top VFET. This dopant drive-in will form the top source and drain 602 of the bottom VFET and the bottom and top source and drains 604 and 606, respectively, of the top VFET. As provided above, the dopants for the source and drains depend on whether a NFET (a p-type dopant) or a PFET (an n-type dopant) is being formed. As shown in FIG. 6, the vertical fin channel (portion 106a of substrate 106) is now present between the bottom source and drain 206 and the top source and drain 602 of the bottom VFET, and the vertical fin channel (portion 102a of the SOI layer 102) is now present between the bottom source and drain 604 and the top source and drain 606. The vertical fin channel of the bottom VFET is separated from the vertical fin channel of the top VFET by the insulator (portion 104a of the buried insulator 104). See FIG. 6.

As will be described in detail below, a top contact to the top VFET can be formed at the top of the fin 204. In order to prevent any potential short to other contacts (e.g., a bottom contact of the top VFET and/or to top and bottom contacts to the bottom VFET—see below), the top doped layer 512 is now removed from the alongside the fin 204 at the top VFET. See FIG. 7. The fin 204 is then buried in an interlayer dielectric 702.

Figure 8:
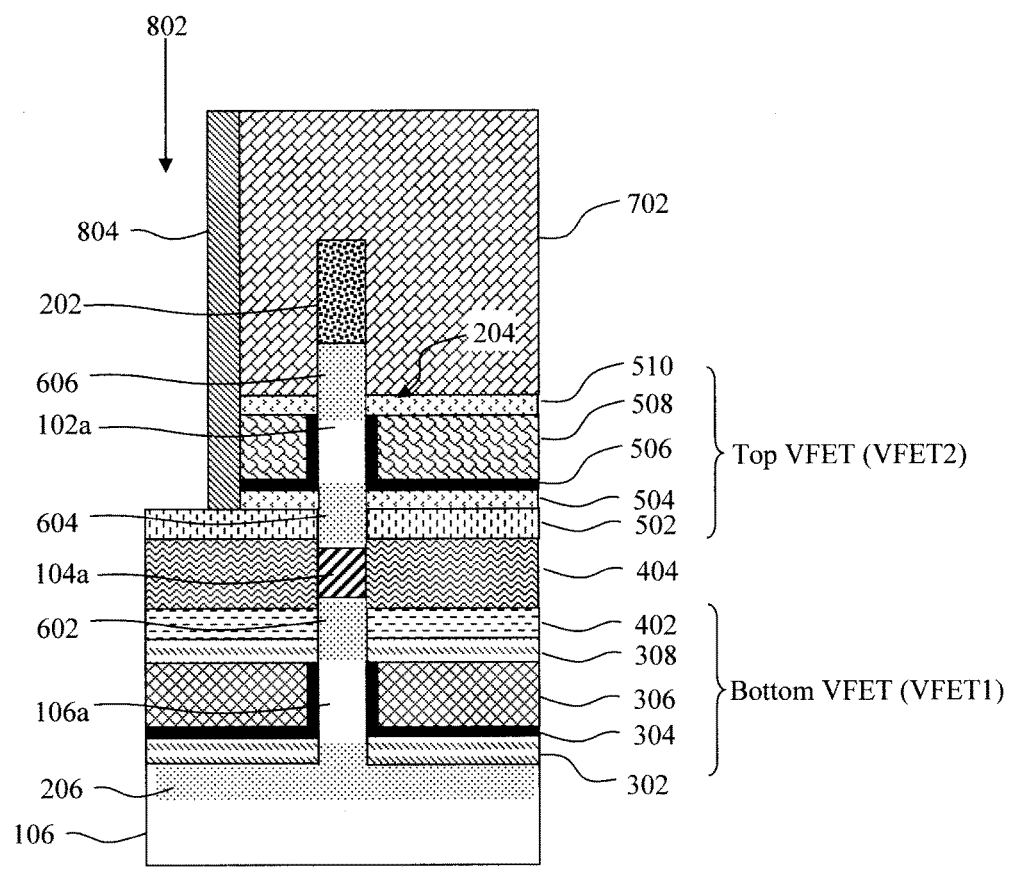
FIG. 8 is a cross-sectional diagram illustrating a contact trench having been patterned down through the ILD, the top spacers of the top VFET, the gate of the top VFET, and the bottom spacers of the top VFET, stopping on the first doped layer of the top VFET, and a sidewall spacer having been formed lining at least one sidewall of the contact trench according to an embodiment of the present invention.
Figure 9:
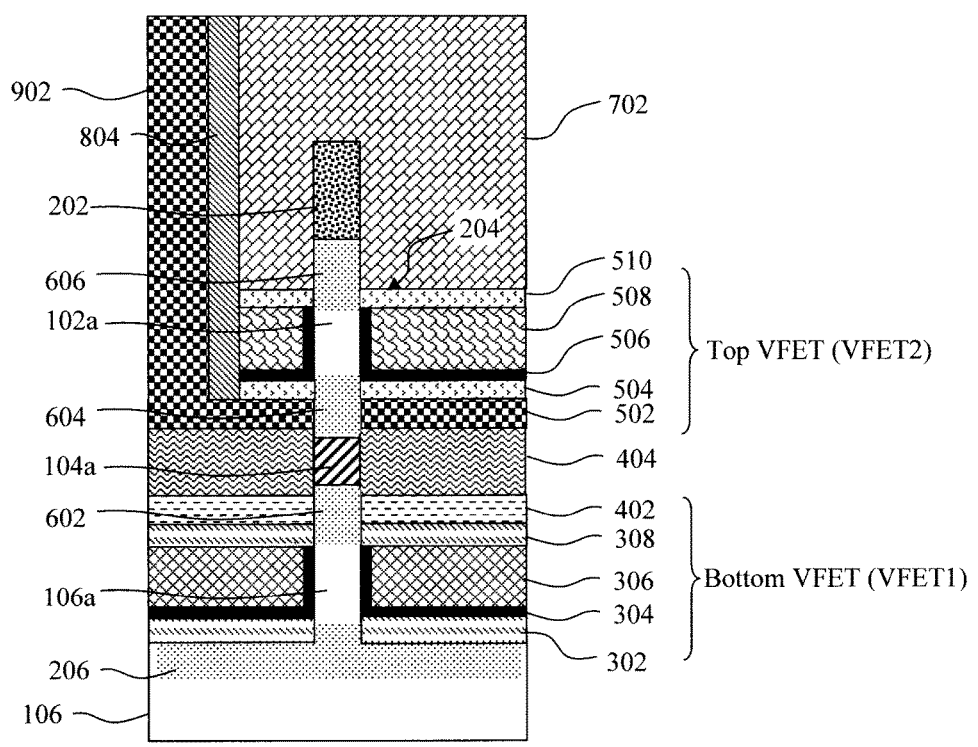
FIG. 9 is a cross-sectional diagram illustrating the first doped layer of the top VFET having been removed and replaced with a contact metal which fills the contact trench, forming a contact to the bottom source and drain of the top VFET according to an embodiment of the present invention.

Exemplary processes for forming source and drain contacts to the top and bottom VFETs are now described. FIG. 8 and FIG. 9, for example, illustrate a process for forming a bottom source and drain contact to the top VFET. As shown in FIG. 8, standard lithography and etching techniques are used to pattern a contact trench 802 extending down through the ILD 702, the top spacers 510, the gate of the top VFET (i.e., through the gate conductor 508 and the gate dielectric 506) and the bottom spacers 504, stopping on the doped layer 502. A directional etching process such as RIE is suitable for the trench etch.

A sidewall spacer 804 is then formed lining the sidewalls of the contact trench 802. The spacer 804 serves to isolate the gate (of the top VFET) from the contact to be formed in the contact trench 802. Suitable materials for the sidewall spacer 804 include nitride spacer materials such as SiN and/or silicon oxynitride SiON. A nitride material is preferable for this sidewall spacer application since, as will be described below, the next task is to remove the doped layer 502 exposed at the bottom of the contact trench 802. As provided above, the doped layer 502 can include BSG or PSG (depending on whether a p-type or an n-type dopant source is needed). Both BSG and PSG are essentially silicon oxide materials doped with boron or phosphorous. Thus, an oxide-selective etch will remove the BSG or PSG doped layer 502, while leaving the sidewall spacer 804 intact and protecting the gate.

An isotropic (non-directional) etching process is then used to remove the doped layer 502 from the top VFET. Suitable isotropic etching processes for removing the doped layer 502 include, but are not limited to, an oxide-selective wet etching process. The doped layer is then replaced with a contact metal which fills the contact trench 802, forming a contact 902 to the bottom source and drain of the top VFET. See FIG. 9. The contact metal can be deposited using a conformal deposition process such as atomic layer deposition (ALD). As shown in FIG. 9, the contact 902 accesses the bottom source and drain 604 of the top VFET. Suitable contact metals include, but are not limited, to Titanium (Ti), copper (Cu), nickel (Ni), platinum (Pt) and/or tungsten (W).

Figure 10:
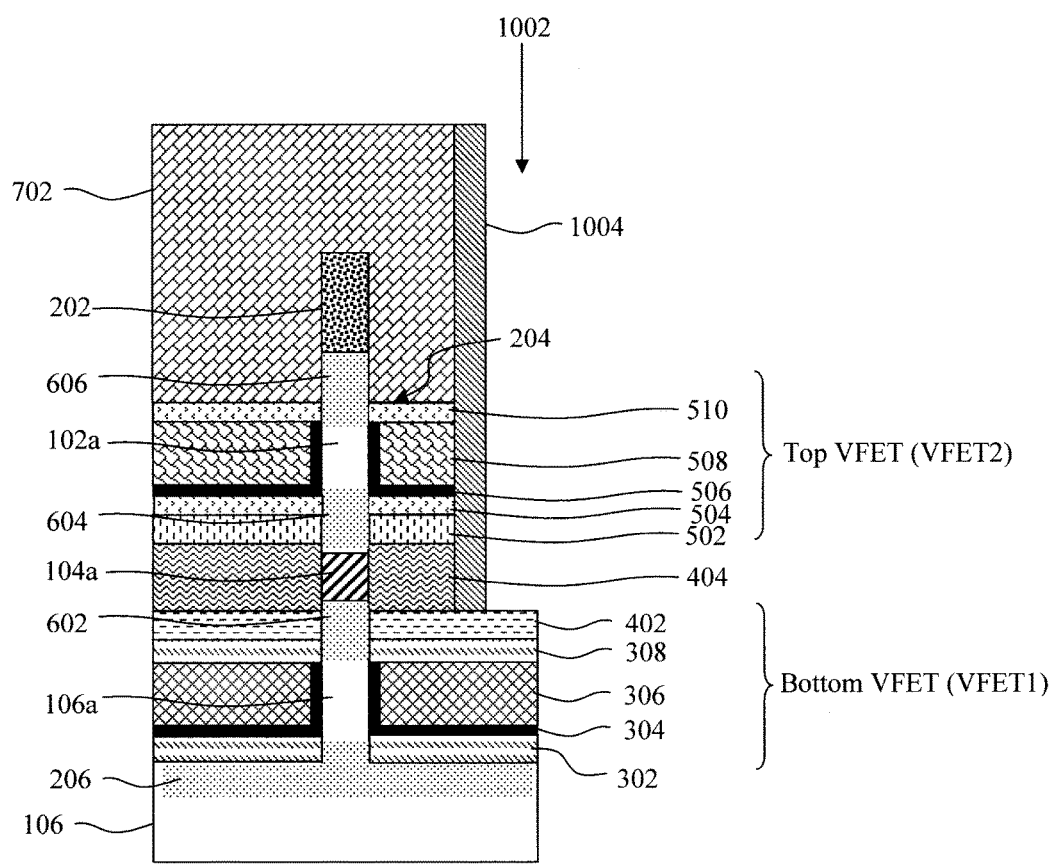
FIG. 10 is a cross-sectional diagram illustrating a contact trench having been patterned down through the ILD, the top spacers of the top VFET, the gate of the top VFET, the bottom spacers of the top VFET, the first doped layer of the top VFET, and the isolation spacer, stopping on the doped layer of the bottom VFET, and a sidewall spacer having been formed lining at least one sidewall of the contact trench according to an embodiment of the present invention.

The same basic process flow can also be used to form a top source and drain contact to the bottom VFET. See, for example, FIG. 10 and FIG. 11. Namely, as shown in FIG. 10, standard lithography and etching techniques are used to pattern a contact trench 1002 extending down through the ILD 702, the top spacers 510, the gate of the top VFET (i.e., through the gate conductor 508 and the gate dielectric 506), the bottom spacers 504, the doped layer 502, and the isolation spacer 404, stopping on the doped layer 402. A directional etching process such as RIE is suitable for the trench etch.

A spacer 1004 (e.g., SiN and/or SiON) is then formed lining the sidewalls of the contact trench 1002. The spacer 1004 serves to isolate the gate (of the top VFET) from the contact to be formed in the contact trench 1002. As described above, use of a nitride spacer material allows for selective removal of the, e.g., BSG or PSG, in doped layer 402 for contact formation.

Figure 11:
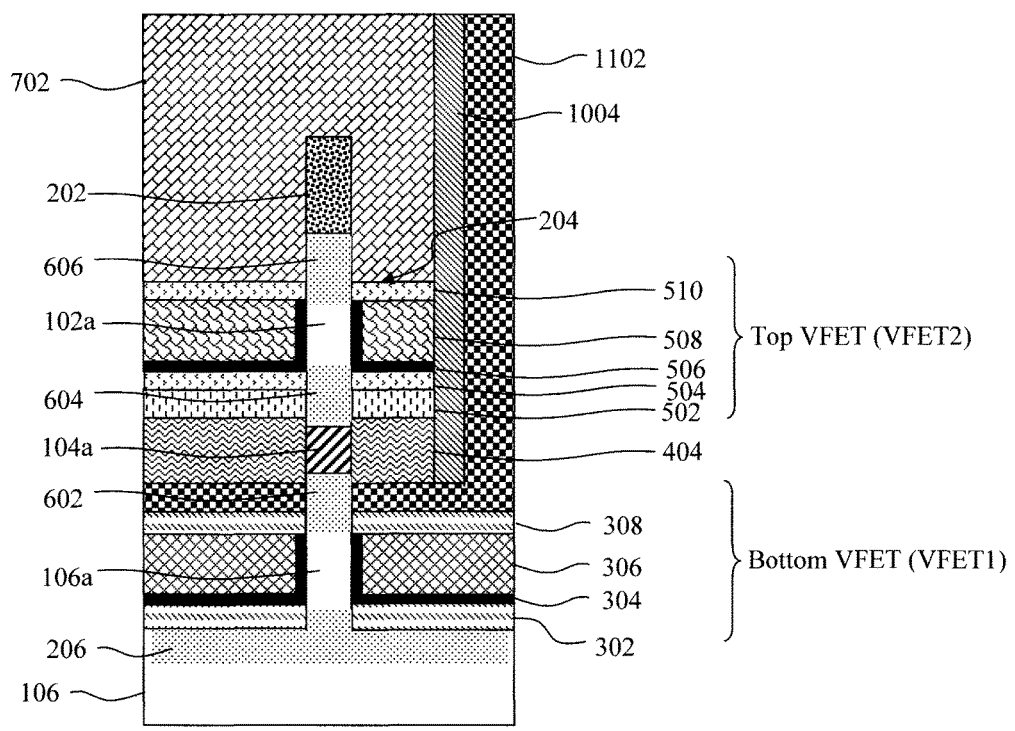
FIG. 11 is a cross-sectional diagram illustrating the doped layer of the bottom VFET having been removed and replaced with a contact metal which fills the contact trench, forming a contact to the top source and drain of the bottom VFET according to an embodiment of the present invention.

An isotropic etching process (such as an oxide-selective wet etching process) is then used to remove the doped layer 402 from the top VFET, and replace the doped layer 402 with a contact metal which fills the contact trench 1002, forming a contact 1102 to the top source and drain of the bottom VFET. See FIG. 11. As shown in FIG. 11, the contact 1102 accesses the top source and drain 602 of the bottom VFET. Suitable contact metals include, but are not limited, to Cu, Ni, Pt and/or W.

Figure 12:
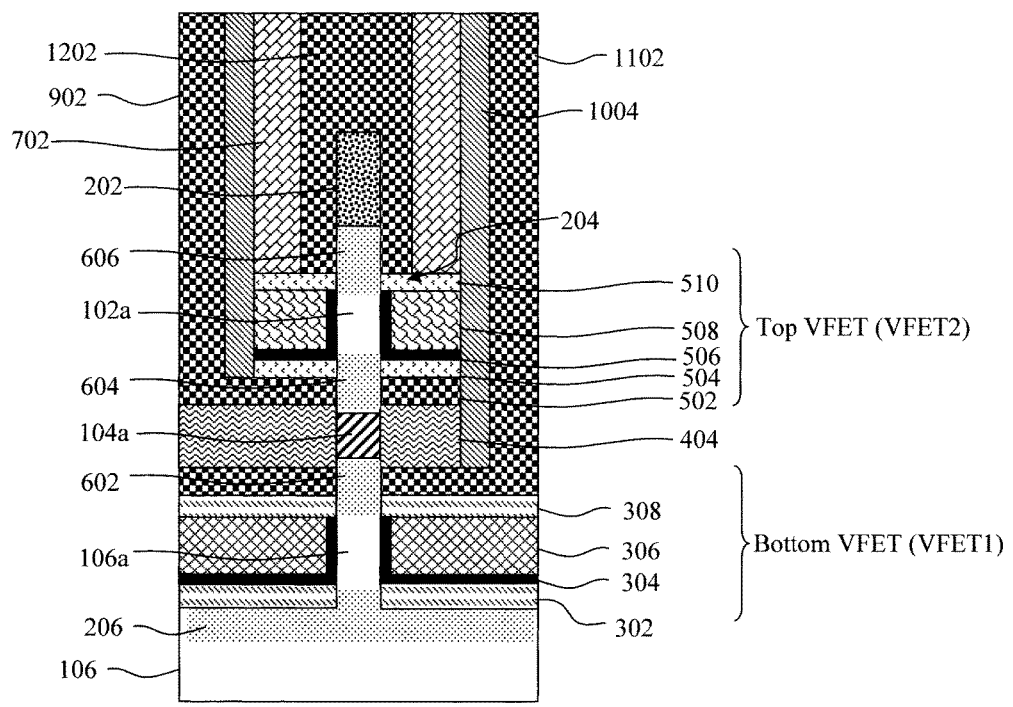
FIG. 12 is a cross-sectional diagram illustrating a top source and drain contact to the top VFET having been formed, along with the contact to the bottom source and drain of the top VFET and the contact to the top source and drain of the bottom VFET according to an embodiment of the present invention.

As highlighted above, a top source and drain contact to the top VFET can be formed over the top of the fin 204. See, for example, FIG. 12. FIG. 12 illustrates this top source and drain contact 1202 along with the other contacts described above (i.e., bottom source and drain contact 902 to the top VFET and top source and drain contact 1102 to the bottom VFET). This exemplary configuration illustrates how the various different contacts described herein can be integrated into the same stacked VFET device.

The process for forming contact 1202 is straightforward. Namely, standard lithography and etching techniques using a directional etching process such as RIE are used to pattern a contact trench in the ILD 702, exposing the top source and drain 606 at the top of the fin 204. The contact trench is then filled with a contact metal forming a contact 1202 to the top source and drain of the top VFET. Suitable contact metals include, but are not limited, to Cu, Ni, Pt and/or W.

Figure 13:
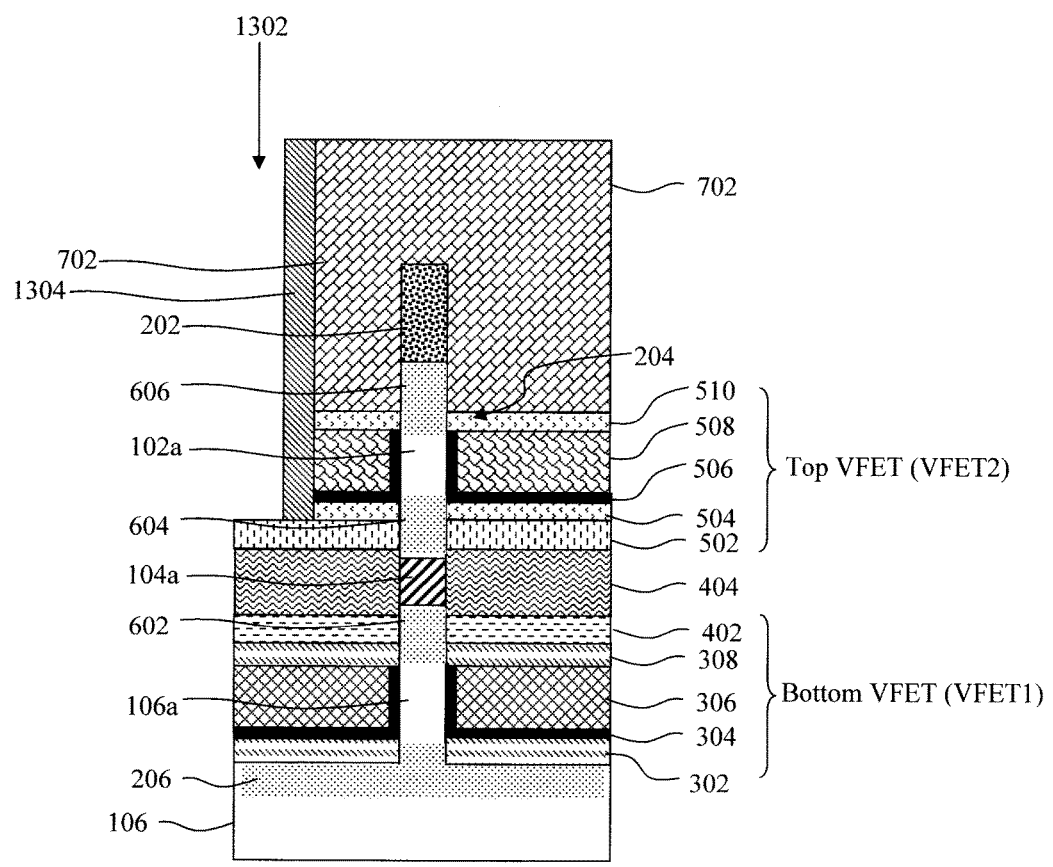
FIG. 13 is a cross-sectional diagram illustrating a contact trench having been patterned down through the ILD, the top spacers of the top VFET, the gate of the top VFET, the bottom spacers of the top VFET, stopping on the first doped layer of the top VFET, and a sidewall spacer having been formed lining at least one sidewall of the contact trench according to an embodiment of the present invention.
Figure 14:
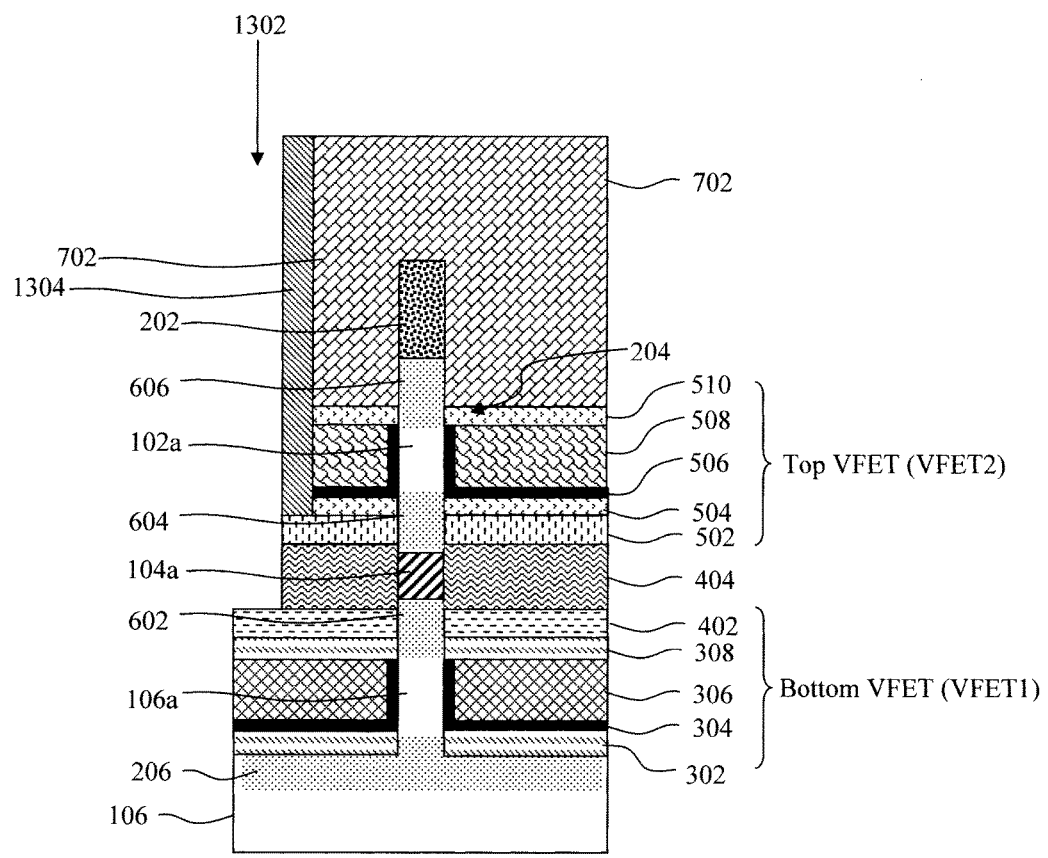
FIG. 14 is a cross-sectional diagram illustrating the contact trench having been extended through the first doped layer of the top VFET, and the isolation spacer, stopping on the doped layer of the bottom VFET according to an embodiment of the present invention.
Figure 15:
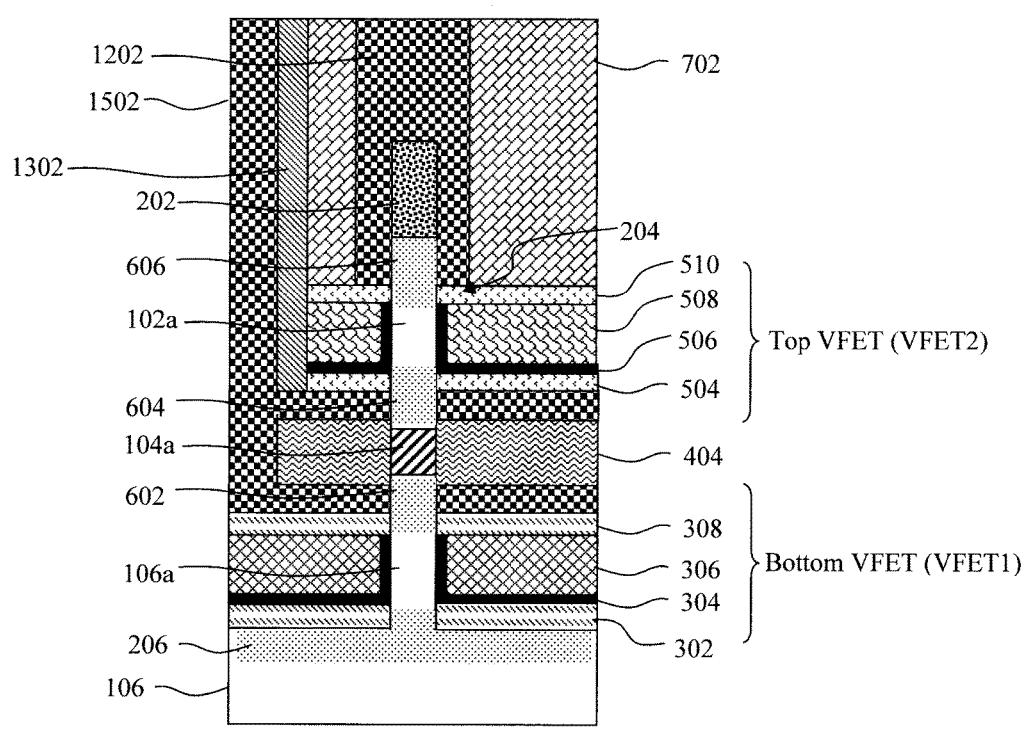
FIG. 15 is a cross-sectional diagram illustrating the first doped layer of the top VFET and the doped layer of the bottom VFET having been removed and replaced with a contact metal which fills the contact trench, forming a shared contact to the bottom source and drain of the top VFET and to the top source and drain of the bottom VFET according to an embodiment of the present invention.

The exemplary contact configuration shown in FIG. 12 has separate top/bottom source and drain contacts for each of the VFETs. However, configurations are also contemplated herein where a shared contact is formed. By way of example only, a common bottom and top source and drain contact to the top and bottom VFETs can be formed as shown in FIGS. 13-15. The same general approach described above is used to form the shared contact. Namely, a contact trench 1302 is first patterned (using, e.g., RIE) extending down through the ILD 702, the top spacers 510, the gate of the top VFET (i.e., through the gate conductor 508 and the gate dielectric 506), the bottom spacers 504, stopping on the doped layer 502. A directional etching process such as RIE is suitable for the trench etch. See FIG. 13. A sidewall spacer 1304 (e.g., SiN and/or SiON) is then formed lining the sidewalls of the contact trench 1302. The sidewall spacer 1304 serves to isolate the gate (of the top VFET) from the (shared) contact that is formed in the contact trench. As described above, use of a nitride spacer material allows for selective removal of the, e.g., BSG or PSG, in doped layer 402 for contact formation.

The contact trench 1302 is then extended through the doped layer 502 and the isolation spacer 404, stopping on the doped layer 402. See FIG. 14. This two-step trench etch is needed to be able to place the spacer 1304 to protect the gate (of the top VFET) yet still be able to access both the doped layers 402 and 502 for removal and replacement with the contact metal. For instance, if instead a single trench etch down to doped layer 402 was performed, and the spacer 1304 then placed along the sidewalls of the trench, the spacer 1304 would undesirably cover over the doped layer 502.

Finally, as shown in FIG. 15, an isotropic etching process (such as an oxide-selective wet etching process) is then used to remove the doped layer 502 from the top VFET and doped layer 402 from the bottom VFET, and replace these doped layers 402/502 with a contact metal which fills the contact trench 1302, forming a contact 1502 to the bottom source and drain of the top VFET and to the top source and drain of the bottom VFET. See FIG. 15. As shown in FIG. 15, the contact 1502 accesses the bottom source and drain 604 of the top VFET and the top source and drain 602 of the bottom VFET. Suitable contact metals include, but are not limited, to Cu, Ni, Pt and/or W. As shown in FIG. 15, this shared source and drain contact configuration can be combined with a top contact 1202, the formation of which was described in detail above.

Figure 16:
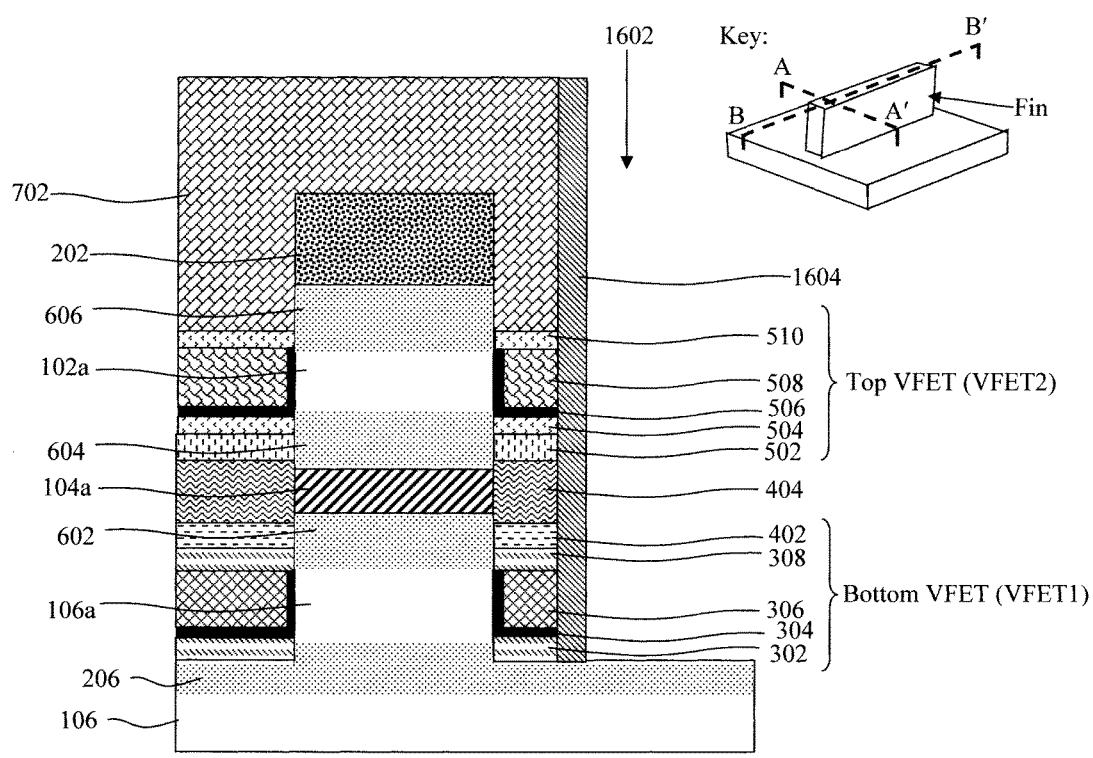
FIG. 16 is a cross-sectional diagram illustrating a contact trench having been patterned down through the ILD, the top spacers of the top VFET, the gate of the top VFET, the bottom spacers of the top VFET, the first doped layer of the top VFET, the isolation spacer, the doped layer of the bottom VFET, the top spacers of the bottom VFET, the gate of the bottom VFET, and the bottom spacers of the bottom VFET, stopping on the substrate, and a sidewall spacer having been formed lining at least one sidewall of the contact trench according to an embodiment of the present invention.
Figure 17:
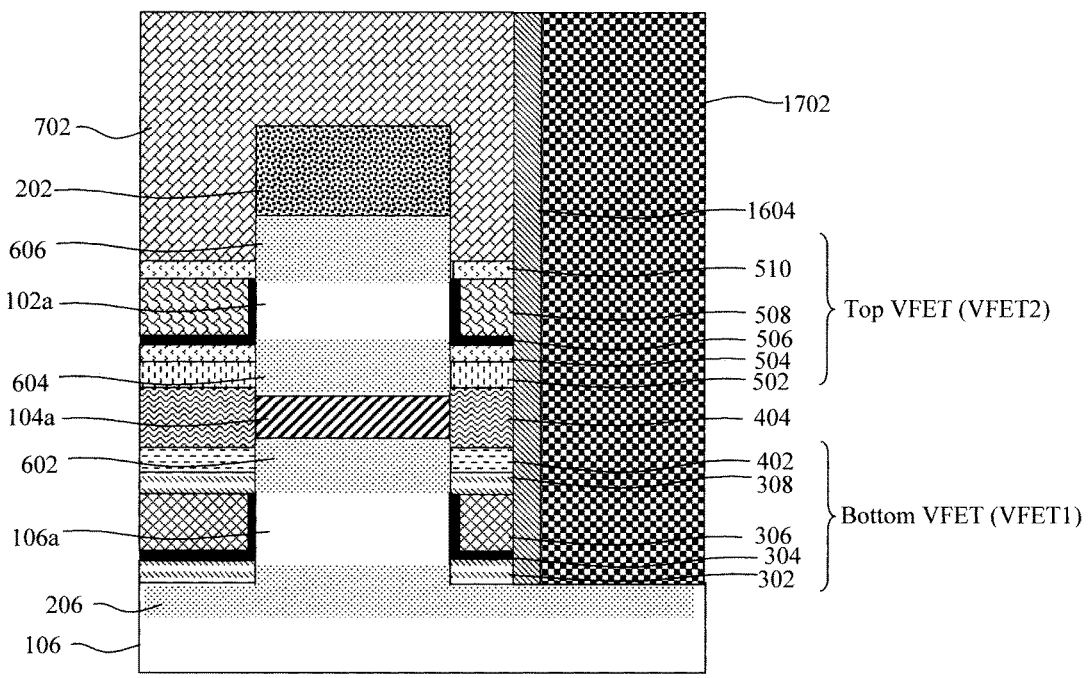
FIG. 17 is a cross-sectional diagram illustrating the contact trench having been filled with a contact metal forming a contact to the bottom source and drain of the bottom VFET according to an embodiment of the present invention.
Figure 18:
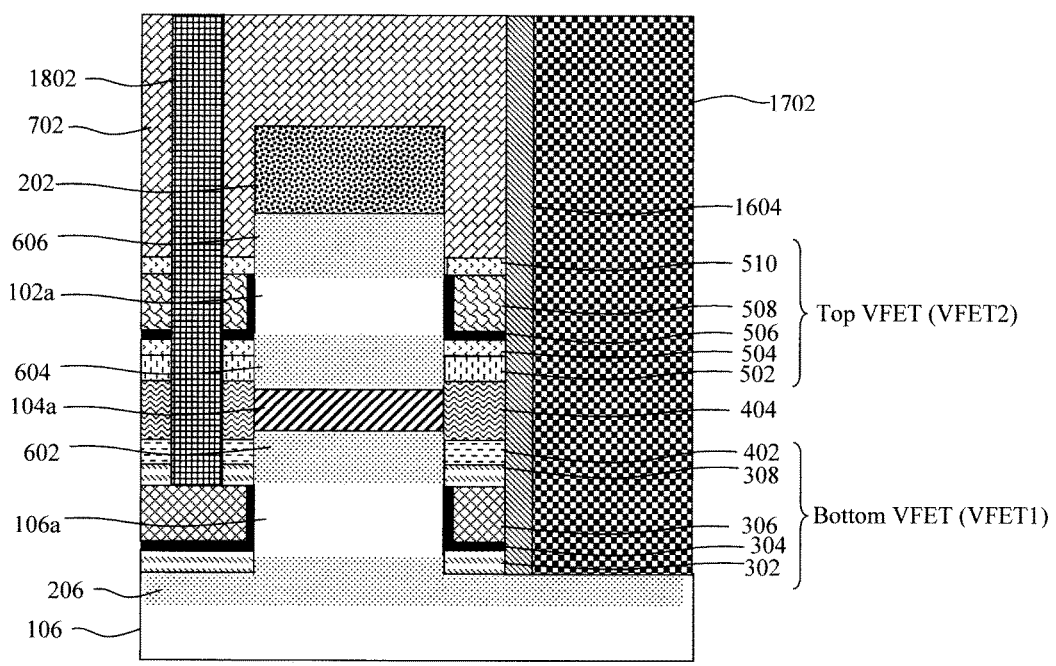
FIG. 18 is a cross-sectional diagram illustrating a shared gate contact having been formed to the gate of the top VFET and the gate of the bottom VFET according to an embodiment of the present invention.

The formation of a bottom source and drain contact to the bottom VFET is now described by way of reference to FIG. 16 and FIG. 17. The view in FIG. 16 and FIG. 17 shifts to a cross-section along the length of the fin 204. Namely, up to this point cross-sectional views along A-A' (see the key at the upper right of FIG. 16) have been shown and described. In FIGS. 16-18, the views shift to cross-sectional views along B-B'.

As described above, the bottom source and drain 206 of the bottom VFET was formed differently from the other source and drains in the stacked device. Namely, bottom source and drain 206 was formed immediately following fin patterning in the substrate 106 at the base of fine 204. Thus, contact can be made to the surface of the substrate 106 (rather than to the fin itself). Specifically, as shown in FIG. 16, standard lithography and etching techniques using a directional etching process such as RIE are used to pattern a contact trench 1602 in the ILD 702, the top spacers 510, the gate of the top VFET (i.e., through the gate conductor 508 and the gate dielectric 506), the bottom spacers 504, the doped layer 502, the isolation spacer 404, the doped layer 402, the top spacers 308, the gate of the bottom VFET (i.e., through the gate conductor 306 and the gate dielectric 304), and the bottom spacers 302, stopping on the substrate 106.

A sidewall spacer 1604 (e.g., SiN and/or SiON) is then formed lining the sidewalls of the contact trench 1602. The sidewall spacer 1604 serves to isolate the gates (of the top and bottom VFET) from the contact to be formed in the contact trench 1602. The contact trench 1602 is then filled with a contact metal forming a contact 1702 to the bottom source and drain of the bottom VFET. See FIG. 17. As shown in FIG. 17, the contact 1702 accesses the bottom source and drain 206 of the bottom VFET. Suitable contact metals include, but are not limited, to Cu, Ni, Pt and/or W.

FIG. 18 illustrates how a shared gate contact 1802 can be formed in the device stack. The process for forming shared gate contact 1802 is straightforward. Namely, standard lithography and etching techniques using a directional etching process such as RIE are used to pattern a contact trench in the ILD 702, the top spacers 510, the gate conductor 508, the gate dielectric 506, the bottom spacers 504, the doped layer 502, the isolation spacer 404, the doped layer 402, the top spacers 308, exposing the gate conductor 306. The contact trench is then filled with a contact metal forming the shared gate contact 1802, i.e., the gate contact 1802 accesses the gates of both the top VFET and the bottom VFET. Suitable contact metals include, but are not limited, to Cu, Ni, Pt and/or W.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a stacked vertical field effect transistor (VFET) device, the method comprising the steps of:
   patterning at least one fin in a wafer, the at least one fin comprising a vertical fin channel of a first VFET (VFET1) separated from a vertical fin channel of a second VFET (VFET2) by an insulator;
   forming a bottom source and drain of the VFET1 below the vertical fin channel of the VFET1;
   forming a gate of the VFET1 alongside the vertical fin channel of the VFET1;
   forming a gate of the VFET2 alongside the vertical fin channel of the VFET2;
   forming a top source and drain of the VFET1 above the vertical fin channel of the VFET1;
   forming a bottom source and drain of the VFET2 below the vertical fin channel of the VFET2;
   forming a top source and drain of the VFET2 above the vertical fin channel of the VFET2; and
   depositing an interlayer dielectric (ILD) over the at least one fin.

2. The method of claim 1, wherein either i) the VFET1 is an n-channel FET (NFET) and the VFET2 is a p-channel FET (PFET), or ii) the VFET1 is a PFET and the VFET2 is an NFET.

3. The method of claim 1, wherein the wafer comprises a semiconductor-on-insulator (SOI) wafer having an SOI layer separated from a substrate by a buried insulator, wherein the at least one fin, as patterned, comprises a patterned portion of the substrate that serves as the vertical fin channel of the VFET1 and a patterned portion of the SOI layer that serves as the vertical fin channel of the VFET2, and wherein a patterned portion of the buried insulator serves as the insulator.

4. The method of claim 1, further comprising the steps of:
   forming bottom spacers of the VFET1 on the bottom source and drain of the VFET1;
   forming the gate of the VFET1 above the bottom spacers of the VFET1;
   forming top spacers of the VFET1 above the gate of the VFET1;
   depositing a doped layer of the VFET1 onto the top spacers of the VFET1;
   forming an isolation spacer on the doped layer of the VFET1;
   depositing a first doped layer of the VFET2 onto the isolation spacer;
   forming bottom spacers of the VFET2 on the first doped layer of the VFET2;
   forming the gate of the VFET2 above the bottom spacers of the VFET2;
   forming top spacers of the VFET2 above the gate of the VFET2;
   depositing a second doped layer of the VFET2 onto the top spacers; and
   driving dopants from the doped layer of the VFET1, the first doped layer of the VFET2, and the second doped layer of the VFET2 into the at least one fin to form the top source and drain of the VFET1, the bottom source and drain of the VFET2, and the top source and drain of the VFET2.

5. The method of claim 4, wherein the doped layer of the VFET1 comprises a first doped material, and wherein the first doped layer of the VFET2 and the second doped layer of the VFET2 each comprises a second doped material.

6. The method of claim 5, wherein either I) the first doped material is boron-doped glass (BSG) and the second doped material is phosphorous-doped glass (PSG), or II) the first doped material is PSG and the second doped material is BSG.

7. The method of claim 4, further comprising the step of:
forming a contact to the bottom source and drain of the VFET2.

8. The method of claim 7, further comprising the steps of:
patterning a contact trench extending down through the ILD, the top spacers of the VFET2, the gate of the VFET2, and the bottom spacers of the VFET2, stopping on the first doped layer of the VFET2;
forming a sidewall spacer along at least one sidewall of the contact trench covering the gate of the VFET2;
removing the first doped layer of the VFET2; and
replacing the first doped layer of the VFET2 with a contact metal which fills the contact trench forming the contact to the bottom source and drain of the VFET2.

9. The method of claim 4, further comprising the step of:
forming a contact to the top source and drain of the VFET1.

10. The method of claim 9, further comprising the steps of:
patterning a contact trench extending down through the ILD, the top spacers of the VFET2, the gate of the VFET2, the bottom spacers of the VFET2, the first doped layer of the VFET2, and the isolation spacer, stopping on the doped layer of the VFET1;
forming a sidewall spacer along at least one sidewall of the contact trench covering the gate of the VFET2;
removing the doped layer of the VFET1; and
replacing the doped layer of the VFET1 with a contact metal which fills the contact trench forming the contact to the top source and drain of the VFET1.

11. The method of claim 4, further comprising the step of:
forming a contact to the top source and drain of the VFET2.

12. The method of claim 11, further comprising the steps of:
patterning a contact trench in the ILD, exposing the top source and drain of the VFET2; and
filling the contact trench with a contact metal to form the contact to the top source and drain of the VFET2.

13. The method of claim 4, further comprising the step of:
forming a shared contact to the top source and drain of the VFET1 and the bottom source and drain of the VFET2.

14. The method of claim 13, further comprising the steps of:
patterning a contact trench extending down through the ILD, the top spacers of the VFET2, the gate of the VFET2, and the bottom spacers of the VFET2, stopping on the first doped layer of the VFET2;
forming a sidewall spacer along at least one sidewall of the contact trench covering the gate of the VFET2;
extending the contact trench down through the first doped layer of the VFET2 and the isolation spacer, stopping on the doped layer of the VFET1;
removing the doped layer of the VFET1 and the first doped layer of the VFET2; and
replacing the doped layer of the VFET1 and the first doped layer of the VFET2 with a contact metal which fills the contact trench forming the shared contact to the top source and drain of the VFET1 and the bottom source and drain of the VFET2.

15. The method of claim 4, further comprising the step of:
forming a contact to the bottom source and drain of the VFET1.

16. The method of claim 15, further comprising the steps of:
patterning a contact trench extending down through the ILD, the top spacers of the VFET2, the gate of the VFET2, the bottom spacers of the VFET2, the first doped layer of the VFET2, the isolation spacer, the doped layer of the VFET1, the top spacers of the VFET1, the gate of the VFET1, and the bottom spacers of the VFET1, stopping on the substrate;
forming a sidewall spacer along at least one sidewall of the contact trench covering the gate of the VFET1 and the gate of the VFET2; and
filling the contact trench with a contact metal to form the contact to the bottom source and drain of the VFET1.

17. The method of claim 1, wherein the step of forming the gate of the VFET1 comprises the steps of:
depositing a conformal dielectric onto the bottom spacers of the VFET1; and
depositing a gate conductor onto the conformal gate dielectric,
wherein the conformal gate dielectric comprises a high-K gate dielectric selected from the group consisting of: hafnium oxide ($HfO_2$), lanthanum oxide ($La_2O_3$) and combinations thereof, and wherein the gate conductor comprises a workfunction setting metal selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W) and combinations thereof.

18. The method of claim 1, wherein the step of forming the gate of the VFET2 comprises the steps of:
depositing a conformal dielectric onto the bottom spacers of the VFET2; and
depositing a gate conductor onto the conformal gate dielectric,
wherein the conformal gate dielectric comprises a high-K gate dielectric selected from the group consisting of: $HfO_2$, $La_2O_3$ and combinations thereof, and wherein the gate conductor comprises a workfunction setting metal selected from the group consisting of: TiN, TaN, Al-containing alloys, TiAl, TiAlN, TiAlC, TaAl, TaAlN, TaAlC, W and combinations thereof.

19. A VFET device, comprising:
at least one fin patterned in a wafer, the at least one fin comprising a vertical fin channel of a first VFET (VFET1) separated from a vertical fin channel of a second VFET (VFET2) by an insulator;
a bottom source and drain of the VFET1 present below the vertical fin channel of the VFET1;
a gate of the VFET1 disposed alongside the vertical fin channel of the VFET1;
a gate of the VFET2 disposed alongside the vertical fin channel of the VFET2;
a top source and drain of the VFET1 present above the vertical fin channel of the VFET1;
a bottom source and drain of the VFET2 present below the vertical fin channel of the VFET2;
a top source and drain of the VFET2 present above the vertical fin channel of the VFET2; and
an ILD over the at least one fin.

20. The VFET device of claim 19, further comprising:
bottom spacers of the VFET1 disposed on the bottom source and drain of the VFET1;
top spacers of the VFET1 disposed above the gate of the VFET1;
a doped layer of the VFET1 disposed on the top spacers of the VFET1;
an isolation spacer disposed on the doped layer of the VFET1;
a doped layer of the VFET2 disposed on the isolation spacer;
bottom spacers of the VFET2 disposed on the doped layer of the VFET2;
top spacers of the VFET2 disposed above the gate of the VFET2; and
a second doped layer of the VFET2 disposed on the top spacers.

21. The VFET device of claim 20, wherein the doped layer of the VFET1 comprises a first doped material, wherein the doped layer of the VFET2 comprises a second doped material, and wherein either I) the first doped material is BSG and the second doped material is PSG, or II) the first doped material is PSG and the second doped material is BSG.

* * * * *